(12) United States Patent
Chang et al.

(10) Patent No.: US 12,406,858 B2
(45) Date of Patent: Sep. 2, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Wei Chang, Hefei (CN); Chun-Hsiang Chen, Hefei (CN); Zhaohong Lv, Hefei (CN); Yongchang Zhuo, Hefei (CN); Tieh-Chiang Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 498 days.

(21) Appl. No.: 17/894,226

(22) Filed: Aug. 24, 2022

(65) Prior Publication Data

US 2023/0369431 A1 Nov. 16, 2023

Related U.S. Application Data

(63) Continuation of application No. PCT/CN2022/093482, filed on May 18, 2022.

(30) Foreign Application Priority Data

May 10, 2022 (CN) .......................... 202210505302.9

(51) Int. Cl.
*H01L 21/3115* (2006.01)
*H01L 21/265* (2006.01)
(Continued)

(52) U.S. Cl.
CPC .... *H01L 21/3115* (2013.01); *H01L 21/26586* (2013.01); *H01L 21/28158* (2013.01);
(Continued)

(58) Field of Classification Search
CPC .......... H01L 21/3115; H01L 21/47576; H01L 21/28158; H01L 29/7825; H01L 29/42352;
(Continued)

(56) References Cited

U.S. PATENT DOCUMENTS 10,103,151 B2 10/2018 Ting et al.
2012/0164812 A1* 6/2012 Ryu ..................... H10B 12/053
438/589
(Continued)

FOREIGN PATENT DOCUMENTS

CN 105374688 A 3/2016
CN 108475679 A 8/2018
(Continued)

OTHER PUBLICATIONS

Chia-Ming Yang et al., "Superior Improvements in GIDL and Retention by Fluorine Implantation in Saddle-Fin Array Devices for Sub-40-nm DRAM Technology," IEEE EDL, vol. 34, No. 9, Sep. 2013, 3 pages.

*Primary Examiner* — Joseph C. Nicely
(74) *Attorney, Agent, or Firm* — Syncoda LLC; Feng Ma (57) ABSTRACT

A semiconductor structure and a method for manufacturing a semiconductor structure are provided. The semiconductor structure includes: a substrate; a gate trench located in the substrate; a gate oxide layer located on a side wall and a bottom of the gate trench; and a gate conductive layer located on a surface of the gate oxide layer, a top of the gate conductive layer being lower than a top of the gate trench. The gate oxide layer includes an ion implantation area. A bottom of the ion implantation area is higher than a bottom of the gate conductive layer and lower than the top of the
(Continued)

gate conductive layer, and a top of the ion implantation area is higher than or flush with the top of the gate conductive layer.

6 Claims, 5 Drawing Sheets

(51) Int. Cl.
  *H01L 21/28* (2006.01)
  *H01L 21/4757* (2006.01)
  *H01L 21/762* (2006.01)
  *H10B 12/00* (2023.01)
  *H10D 30/65* (2025.01)
  *H10D 30/69* (2025.01)
  *H10D 64/01* (2025.01)
  *H10D 64/27* (2025.01)

(52) U.S. Cl.
  CPC .. *H01L 21/47576* (2013.01); *H01L 21/76224* (2013.01); *H10B 12/053* (2023.02); *H10B 12/34* (2023.02); *H10B 12/485* (2023.02); *H10D 30/658* (2025.01); *H10D 30/699* (2025.01); *H10D 64/027* (2025.01); *H10D 64/513* (2025.01); *H10B 12/315* (2023.02)

(58) Field of Classification Search
  CPC .......... H01L 29/66621; H01L 29/4236; H10B 12/053; H10B 12/34; H10D 30/658; H10D 30/699; H10D 64/027; H10D 64/513
  See application file for complete search history.

(56) References Cited

U.S. PATENT DOCUMENTS

| | | | |
|---|---|---|---|
| 2014/0312401 A1* | 10/2014 | Lee | H10B 12/34 257/296 |
| 2014/0361354 A1* | 12/2014 | Ting | H10D 30/025 257/288 |
| 2017/0179133 A1 | 6/2017 | Ruffell et al. | |
| 2021/0134975 A1* | 5/2021 | Umezawa | H10D 64/667 |
| 2022/0044972 A1* | 2/2022 | Cheng | H01L 21/2822 |
| 2023/0290877 A1* | 9/2023 | Moriya | H10D 64/513 |

FOREIGN PATENT DOCUMENTS

| | | |
|---|---|---|
| CN | 208655649 U | 3/2019 |
| CN | 111063722 A | 4/2020 |
| CN | 112086454 A | 12/2020 |
| JP | H1056147 A | 2/1998 |

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This application is a continuation application of International Patent Application No. PCT/CN2022/093482, filed on May 18, 2022, which claims priority to Chinese Patent Application No. 202210505302.9, filed on May 10, 2022. The disclosures of International Patent Application No. PCT/CN2022/093482 and Chinese Patent Application No. 202210505302.9 are hereby incorporated by reference in their entireties.

BACKGROUND

A Dynamic Random Access Memory (DRAM) is a semiconductor device commonly used in electronic devices such as a computer. The DRAM consists of a plurality of memory cells, and each of the memory cells usually includes a transistor and a capacitor. A gate of the transistor is electrically connected to a word line, a source of the transistor is electrically connected to a bit line, and a drain of the transistor is electrically connected to the capacitor. A word line voltage on the word line can control the opening and closing of the transistor, so that data information stored in the capacitor can be read through the bit line, or written into the capacitor.

In order to realize high density storage of the DRAM while increasing the yield of the DRAM, the main process currently employed is to reduce the pattern dimension in the DRAM. On this basis, a buried gate has been a mainstream development trend. However, the buried gate is easily affected by the Gate-Induced Drain Leakage (GIDL) effect, thus affecting the performance and the reliability of the memory cell and even causing the problems such as the error of the data access of the DRAM.

Therefore, how to reduce the GIDL effect in the device is a technical problem that needs to be urgently solved at present.

SUMMARY

The disclosure relates to the technical field of semiconductor manufacturing, and in particular to a semiconductor structure and a method for manufacturing a semiconductor structure.

According to embodiments of the disclosure, a semiconductor structure and a method for manufacturing a semiconductor structure are provided.

According to a first aspect of some embodiments of the disclosure, a semiconductor structure is provided, including:
  a substrate;
  a gate trench located in the substrate;
  a gate oxide layer located on a side wall and a bottom of the gate trench; and
  a gate conductive layer located on a surface of the gate oxide layer, in which a top of the gate conductive layer is lower than a top of the gate trench.

The gate oxide layer includes an ion implantation area, a bottom of the ion implantation area is higher than a bottom of the gate conductive layer and lower than the top of the gate conductive layer, and a top of the ion implantation area is higher than or flush with the top of the gate conductive layer.

According to another aspect of some embodiments of the disclosure, a method for manufacturing a semiconductor structure is provided, including the following operations.

A substrate is provided.

A gate trench is formed in the substrate, and a gate oxide layer is formed on a side wall and a bottom of the gate trench.

A gate conductive layer is formed on a surface of the gate oxide layer, in which a top of the gate conductive layer is lower than a top of the gate trench.

Ion implantation is performed on the gate oxide layer to form an ion implantation area in the gate oxide layer, where a bottom of the ion implantation area is higher than a bottom of the gate conductive layer and lower than the top of the gate conductive layer, and a top of the ion implantation area is higher than or flush with the top of the gate conductive layer.

The details of one or more embodiments of the disclosure are provided in the accompanying drawings and the description below. Other features, objectives, and advantages of the disclosure will become apparent from the description, drawings, and claims.

BRIEF DESCRIPTION OF THE DRAWINGS

In order to describe the technical solutions in the embodiments of the disclosure more clearly, the following briefly introduces the accompanying drawings required for describing the embodiments. It is apparent that the accompanying drawings in the following description show only some embodiments of the disclosure, and those skilled in the art may still derive accompanying drawings of other embodiments from these accompanying drawings without creative efforts.

FIG. 2 is also a schematic cross-sectional diagram of a semiconductor structure according to an embodiment of the disclosure.

FIG. 3 is also a schematic cross-sectional diagram of a semiconductor structure according to another embodiment of the disclosure.

DETAILED DESCRIPTION

For ease of understanding of embodiments of the disclosure, embodiments of the disclosure will be described more fully below with reference to related drawings. Preferred embodiments of embodiments of the disclosure are shown in the drawings. However, embodiments of the disclosure may be implemented in many different forms, which are not limited to the embodiments described herein. Instead, these embodiments are provided for making embodiments of the disclosure more thorough and complete.

Unless otherwise specified, all technical and scientific terms used herein have the same meanings as commonly understood by those skilled in the technical field to which embodiments of the disclosure relate. The terms used in the description of embodiments of the disclosure are for the purpose of describing specific embodiments only, and are not intended to limit embodiments of the disclosure.

It should be understood that when an element or layer is referred to as "in electrical contact with" or "in contact with" another element or layer, it can be directly in electrical contact with or contact with the another element or layer, or intervening elements or layers may be present. It should be understood that though the terms, first, second, etc., are used to describe the elements, components, areas, layers, doping types and/or sections, these elements, components, areas, layers, doping types and/or sections should not be limited by these terms. These terms are merely used to distinguish one element, component, area, layer, doping type or section from another element, component, area, layer, doping type, or section. Thus, a first element, component, area, layer, doping type or section, which is discussed below, may be referred to as a second element, component, area, layer or section, without departing from the scope of embodiments of the disclosure. For example, a first opening may be referred to as a second opening. Moreover, similarly, a second opening may be referred to as a first opening. The first opening and the second opening are different openings.

Spatial relationship terms, such as "under", may be used to describe the relationship between one element or feature and another element or feature as illustrated in the drawings. It should be understood that the spatial relationship terms are intended to encompass different orientations of a device in use or operation, in addition to the orientation depicted in the drawings. For example, if the device in the drawings is turned over, an element or feature described as "below" another element would then be oriented "above" relative to the another element or feature. Therefore, the exemplary term "below" can encompass both the above orientation and the below orientation. In addition, the device may be otherwise oriented (for example, it is rotated by 90 degrees or at other orientations), and the spatial relationship terms used herein are interpreted accordingly.

As used herein, the singular forms "a", "an" and "the/said" are intended to include the plural forms as well, unless the context clearly indicates otherwise. It should be further understood that the terms "consisting of" and/or "include", when used in this description, specify the presence of stated features, integers, steps, operations, elements, and/or components, but do not preclude the presence or addition of one or more other features, integers, steps, operations, elements, components, and/or groups thereof. In addition, as used herein, the term "and/or" includes any combination and all combinations of the associated listed items.

Embodiments of the disclosure are described herein with reference to cross-sectional diagrams as schematic diagrams of ideal embodiments (and intermediate structures) of embodiments of the disclosure. Thus, changes from the shown shapes due to, for example, manufacturing techniques and/or tolerances can be expected. Therefore, the embodiments of the disclosure should not be limited to the specific shapes of the area as shown herein, but include shape deviations due to, for example, manufacturing techniques. Therefore, the areas shown in the drawings are substantially schematic, and their shapes are not intended to illustrate the actual shape of areas of a device and are not intended to limit the scope of embodiments of the disclosure.

Please refer to FIG. 1 to FIG. 5. It should be noted that the illustrations provided in embodiments of the disclosure are only to illustrate the basic idea of embodiments of the disclosure in a schematic way, and although only components related to embodiments of the disclosure are shown in the drawings and not drawn according to the number, shape, and dimension of the components in actual implementation, the type, number, and ratio of each component in actual implementation can be arbitrarily changed, and layout patterns of the components may also be more complex.

According to some embodiments of the disclosure, a method for manufacturing a semiconductor structure is provided.

Figure 1:
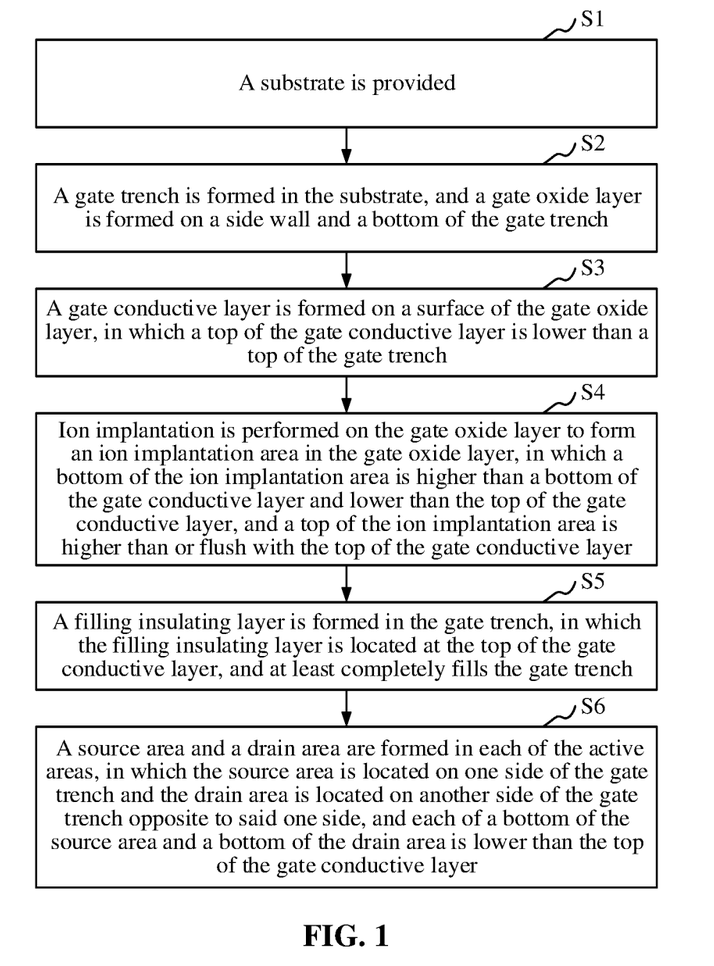
FIG. 1 is a flowchart of a method for manufacturing a semiconductor structure according to an embodiment of the disclosure.

With reference to FIG. 1, in an embodiment, the method for manufacturing the semiconductor structure includes the following operations.

At S1, a substrate is provided.

At S2, at least one gate trench is formed in the substrate, and a gate oxide layer is formed on a side wall and a bottom of the gate trench.

At S3, a gate conductive layer is formed on a surface of the gate oxide layer. It should be noted that a top of the gate conductive layer should be lower than a top of the gate trench.

At S4, ion implantation is performed on the gate oxide layer to form an ion implantation area in the gate oxide layer. It should be noted that a bottom of the ion implantation area should be higher than a bottom of the gate conductive layer and lower than the top of the gate conductive layer, and a top of the ion implantation area should be higher than or flush with the top of the gate conductive layer.

Specifically, with continuing reference to FIG. 1, ion implantation is performed on the gate oxide layer, so that an equivalent thickness of the gate oxide layer is increased, and an electric field strength in a gate-drain overlap area is decreased, thereby reducing the Gate-Induced Drain Leakage (GIDL) effect in the obtained structure, improving the performance of the device, improving the yield and the reliability of the device, and avoiding the problems such as the error of the data access occurring in the device while reducing the leakage current when the device is in an off state, reducing the static power consumption, and prolonging the service life of the device. In the method for manufacturing the semiconductor structure according to embodiments of the disclosure, a bottom of the ion implantation area formed in the gate oxide layer is higher than a bottom of the gate conductive layer and lower than the top of the gate conductive layer, and a top of the ion implantation area is higher than or flush with the top of the gate conductive layer. That is, the ion implantation area formed in the gate oxide layer is located at an edge of the gate oxide layer, so that an equivalent thickness of the edge of the gate oxide layer is increased, and an equivalent thickness of a part of the gate oxide layer other than the ion implantation area maintains unchanged, thereby ensuring that the performance of the device is not affected while reducing the GIDL effect in the obtained structure.

It should be noted that doped ions in the ion implantation area located at the edge of the gate oxide layer can be observed by, but not limited to, a Transmission Electron Microscope (TEM).

Figure 2:
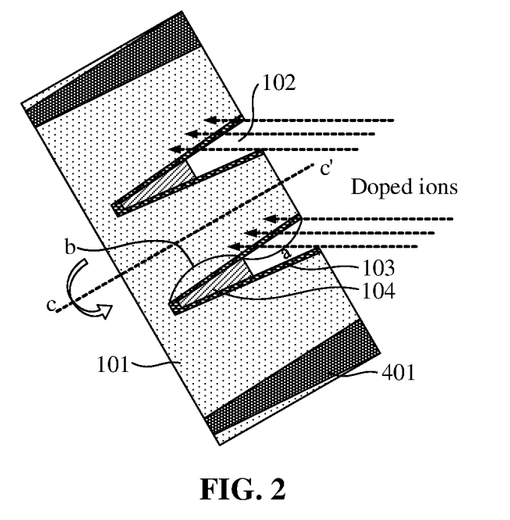
FIG. 2 is a schematic cross-sectional diagram of a structure obtained in a method for manufacturing a semiconductor structure according to an embodiment of the disclosure.
Figure 3:
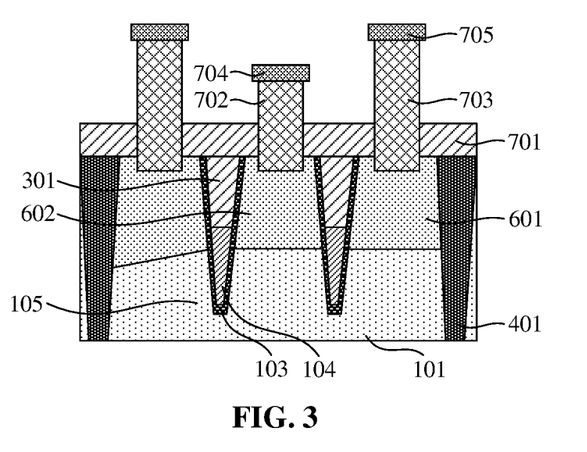
FIG. 3 is a schematic cross-sectional diagram of a structure obtained in a method for manufacturing a semiconductor structure according to another embodiment of the disclosure.

At S1, with reference to FIG. 2 and FIG. 3 in combination with FIG. 1, a substrate 101 is provided.

In the method for manufacturing the semiconductor structure according to embodiments of the disclosure, the material of the substrate 101 is not specifically limited. As an example, the substrate 101 includes, but is not limited to, any one or more of a silicon substrate, a sapphire substrate, a glass substrate, a silicon carbide substrate, a gallium nitride substrate, or a gallium arsenide substrate, etc. That is, the material of the substrate 101 includes, but is not limited to, any one or more of silicon (Si), sapphire, glass, silicon carbide (SiC), gallium nitride (GaN), or gallium arsenide (GaAs), etc.

With continuing reference to FIG. 2 and FIG. 3, in an embodiment, Shallow Trench Isolation (STI) structures 401 are formed in the substrate 101. Multiple active areas (AAs) arranged at intervals in the substrate 101 are isolated from each other by the STI structures 401.

According to embodiments of the disclosure, the manner in which the STI structures 401 are formed in the substrate 101 is not specifically limited. As an example, the operation that the STI structures 401 are formed in the substrate 101 is performed using the following manner. For example, a first mask layer is formed on an upper surface of the substrate 101. The first mask layer is patterned to obtain a first patterned mask layer. The first patterned mask layer has a first opening pattern. The first opening pattern can define the positions of the STI structures 401. The substrate 101 is etched based on the first patterned mask layer to form shallow trenches in the substrate 101. The shallow trenches are filled with an isolation material to form the STI structures 401.

According to embodiments of the disclosure, in the above operation, the manner in which the shallow trenches are filled with the isolation material to form the STI structures 401 is not specifically limited. As an example, the operation that the STI structures 401 are formed in the substrate 101 is performed using the following manner. For example, the isolation material is filled in the shallow trenches and on an upper surface of the substrate 101. The isolation material located on the upper surface of the substrate 101 is removed, in which the shallow trenches are completely filled with a remaining part of the isolation material, and an upper surface of the remaining part of the isolation material is flush with the upper surface of the substrate 101.

As an example, the isolation material is filled in the shallow trenches and on the upper surface of the substrate 101 using, but not limited to, a High Density Plasma-Chemical Vapor Deposition (HDPCVD) process, a flowable oxide Chemical Vapor Deposition (CVD) process, or a Spin-on Dielectric (SOD) process.

As an example, the isolation material includes, but is not limited to, silicon dioxide ($SiO_2$).

As an example, the isolation material located on the upper surface of the substrate 101 is removed using, but not limited to, a Chemical Mechanical Polishing (CMP) process.

At S2, with continuing reference to FIG. 1 to FIG. 3, at least one gate trench 102 is formed in the substrate 101, and a gate oxide layer 103 is formed on a side wall and a bottom of the gate trench 102.

In the above operation S2, a plurality of gate trenches 102 may be formed in the substrate 101, and the plurality of gate trenches 102 may be arranged at intervals in the substrate 101.

According to embodiments of the disclosure, the manner in which the gate trenches 102 are formed in the substrate 101 is not specifically limited. As an example, the operation that the gate trenches 102 are formed in the substrate 101 is performed using the following manner. For example, a first photoresist layer is formed on the substrate 101 using a coating-curing process, an inkjet printing process, or a deposition process. The first photoresist layer covers the upper substrate of the substrate 101. The first photoresist layer is patterned using patterning processes, such as masking, exposure, development and etching, to form a mask pattern. The mask pattern includes a plurality of shielding areas and a plurality of opening areas, and the plurality of shielding areas and the plurality of opening areas are alternately arranged. A part of a depth of the substrate 101 located in the opening areas is removed, to form a plurality of grooves arranged at intervals on the substrate 101. The first photoresist layer is removed. That is, the first photoresist layer to be removed is cleared away using a cleaning process, for example ultrasonic cleaning or plasma cleaning, to form a plurality of gate trenches 102 arranged at intervals in the substrate 101.

According to embodiments of the disclosure, the manner in which the gate oxide layer 103 is formed on the side wall and the bottom of the gate trench 102 is not specifically limited, either. As an example, the gate oxide layer 103 is formed on the side wall and the bottom of the gate trench 102 using, but not limited to, any one of a Physical Vapor Deposition (PVD) process, a Chemical Vapor Deposition (CVD) process, a Flowable CVD (FCVD), a High Density Plasma (HDP) process, a plasma-enhanced deposition process, or an atomic layer deposition process, etc.

In addition, in the method for manufacturing the semiconductor structure according to embodiments of the disclosure, the material of the gate oxide layer 103 is also not specifically limited. As an example, the gate oxide layer 103 includes, but is not limited to, any one or more of a silicon dioxide layer, a high-k dielectric material layer, or other dielectric material layers, etc. That is, the material of the gate oxide layer 103 includes, but is not limited to, any one or more of silicon dioxide, high-k dielectric materials, or other dielectric materials, etc.

In an embodiment, as shown in FIG. 3, before the gate trench 102 is formed in the substrate 101, a well area 105 is formed in the active areas. The well area 105 is located in the active areas and located under the ion implantation area a.

According to embodiments of the disclosure, the manner in which the well area 105 is formed in the active areas is not specifically limited. As an example, ion implantation is performed at a set position of the substrate 101 using an ion implantation process to form the well area 105.

It can be understood that when the substrate 101 is N-type, the type of ions for ion implantation is P-type, and when the substrate 101 is P-type, the type of ions for ion implantation is N-type.

According to embodiments of the disclosure, the type of P-type impurity ions is not specifically limited. As an example, the P-type impurity ions include, but are not limited to, any one or more of boron (B) ions, magnesium (Mg) ions, or indium (In) ions, etc. Similarly, according to embodiments of the disclosure, the type of N-type impurity ions is not specifically limited. As an example, the N-type impurity ions include, but are not limited to, one or more of phosphorus (P) ions, arsenic (As) ions, or antimony (Sb) ions, etc.

At S3, with continuing reference to FIG. 1 to FIG. 3, a gate conductive layer 104 is formed on a surface of the gate oxide layer 103. A top of the gate conductive layer 104 should be lower than a top of the gate trench 102.

According to embodiments of the disclosure, the manner in which the gate conductive layer 104 is formed on the surface of the gate oxide layer 103 is not specifically limited. As an example, the operation that the gate conductive layer 104 is formed on the surface of the gate oxide layer 103 is executed using the following manner.

For example, a gate conductive material layer is formed, in which the gate conductive material layer completely fills the gate trench 102, and covers the surface of the gate oxide layer 103. A part of the gate conductive material layer is removed, in which a remaining part of the gate conductive material layer forms the gate conductive layer 104.

According to embodiments of the disclosure, the manner in which the gate conductive material layer is formed is not specifically limited. As an example, the gate conductive material layer is formed using, but not limited to, a deposition process. The deposition process according to embodiments of the disclosure includes, but is not limited to, any one or more of a PVD process, a CVD process, an FCVD process, an HDP process, a plasma-enhanced deposition process, or an atomic layer deposition process, etc.

According to embodiments of the disclosure, the manner in which a part of the gate conductive material layer is removed is not specifically limited As an example, a part of the gate conductive material layer is removed using, but not limited to, a dry etching process, in which a remaining part of the gate conductive material layer forms the gate conductive layer 104.

In the method for manufacturing the semiconductor structure according to embodiments of the disclosure, the material of the gate conductive material layer and the gate conductive layer 104 is not specifically limited, either. As an example, the gate conductive material layer and the gate conductive layer 104 include, but are not limited to, any one or more of titanium nitride (TiN), titanium (Ti), tungsten silicide ($Si_2W$), or tungsten (W), etc.

With continuing reference to FIG. 1 to FIG. 3, at S4, ion implantation is performed on the gate oxide layer 103 to form an ion implantation area a in the gate oxide layer 103.

It should be noted that a bottom of the ion implantation area a should be higher than a bottom of the gate conductive layer 104 and lower than the top of the gate conductive layer 104, and a top of the ion implantation area a should be higher than or flush with the top of the gate conductive layer 104.

According to embodiments of the disclosure, the type of ions implanted in the process of performing ion implantation on the gate oxide layer 103 at S4 is not specifically limited. As an example, implanted ions include, but are not limited to, fluorine (F) ions.

In an embodiment, in the process of performing ion implantation on the gate oxide layer 103, implanted ions at least include fluorine ions.

Specifically, fluorine ion implantation is performed on the gate oxide layer 103, so that an equivalent thickness of the edge of the gate oxide layer 103 is increased, and an equivalent thickness of a part b of the gate oxide layer other than the ion implantation area maintains unchanged, thereby ensuring that the performance of the device is not affected while reducing the GIDL effect in the obtained structure.

As an example, when fluorine ion implantation is performed the gate oxide layer 103 at S4, the implantation dose of the fluorine ions ranges from $1.5\times10^{14}$ ions/cm$^2$ to $5\times10^{14}$ ions/cm$^2$. For example, when fluorine ion implantation is performed on the gate oxide layer 103, the implantation dose of the fluorine ions is $1.5\times10^{14}$ ions/cm$^2$, $2.5\times10^{14}$ ions/cm$^2$, $3.5\times10^{14}$ ions/cm$^2$, $4.5\times10^{14}$ ions/cm$^2$, or $5\times10^{14}$ ions/cm$^2$, etc. It should be noted that the data is merely an example, and does not limit the implantation dose of the fluorine ions when fluorine ion implantation is performed on the gate oxide layer 103 in the actual embodiments.

Figure 4:
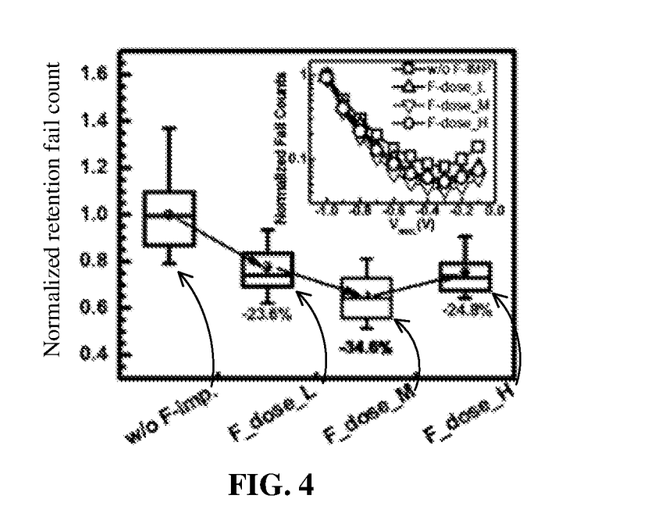
FIG. 4 is a schematic diagram illustrating a correspondence between an implantation dose of fluorine ions and a normalized retention fail count in a method for manufacturing a semiconductor structure according to an embodiment of the disclosure.

With reference to FIG. 4, a normalized retention fail count of a sample in which fluorine ion implantation is not performed on the gate oxide layer 103 is set as 1. When fluorine ion implantation is performed on the gate oxide layer 103, a normalized retention fail count of samples having a low fluorine ion dose (represented by F_dose_L in FIG. 4), a moderate fluorine ion dose (represented by F_dose_M in FIG. 4), and a high fluorine ion dose (represented by F_dose_H in FIG. 4) is observed to be significantly decreased by 23.6%, 34.6%, and 24.8%, respectively. Hence, the lowest GIDL can be observed in a sample in which fluorine ions having a moderate dose (ranging from $1.5\times10^{14}$ ions/cm$^2$ to $5\times10^{14}$ ions/cm$^2$) are implanted in the gate oxide layer 103.

According to embodiments of the disclosure, the manner in which ion implantation is performed on the gate oxide layer 103 at S4 is not specifically limited.

In an embodiment, with continuing reference to FIG. 2, the obtained structure is inclined by a preset angle, and horizontal ion implantation is performed on the obtained structure. In addition, in the horizontal ion implantation process, the obtained structure is rotated about a rotation axis cc' for a preset number of times. It should be noted that the rotation axis cc' may be a normal line to a surface of the obtained structure and pass through a midpoint of a bottom surface of the obtained structure.

As an example, the preset angle by which the obtained structure is inclined at S4 ranges from 15° to 40°. For example, the obtained structure is inclined by 15°, 20°, 25°, 35°, or 40°, etc. at S4. It should be noted that the data is merely an example, and does not limit the angle by which the obtained structure is inclined at S4 in the actual embodiments.

As an example, the preset number of times for which the obtained structure is rotated about the rotation axis cc' at S4 ranges from 2 times to 8 times. For example, the obtained structure is rotated about the rotation axis cc' at S4 for 2, 4, 6, or 8 times, etc. It should be noted that the data is merely an example, and does not limit the number of times for which the obtained structure is rotated at S4 in the actual embodiments.

With continuing reference to FIG. 1 to FIG. 3, in an embodiment, after ion implantation is performed on the gate oxide layer 103, the method includes the following operation.

At S5, a filling insulating layer 301 is formed in the gate trench 102. It should be noted that the filling insulating layer 301 should be located at the top of the gate conductive layer 104, and at least completely fill the gate trench 102.

In the method for manufacturing the semiconductor structure according to embodiments of the disclosure, the material of the filling insulating layer 301 formed at S5 is not specifically limited. As an example, the filling insulating layer 301 includes, but is not limited to, one or more of a silicon dioxide layer, a silicon nitride (SiN) layer, or a silicon oxynitride ($SiO_xN_y$) layer, etc. That is, the material of the filling insulating layer 301 includes, but is not limited to, one or more of silicon dioxide, silicon nitride, or silicon oxynitride, etc.

According to embodiments of the disclosure, the manner in which the filling insulating layer 301 is formed at S5 is not specifically limited, either. As an example, the filling insulating layer 301 is formed in the gate trench 102 using, but not limited to, any one of a PVD process or a CVD process.

With continuing reference to FIG. 1 to FIG. 3, in an embodiment, after the filling insulating layer 301 is formed in the gate trench 102, the method includes the following operation.

At S6, a source area 601 and a drain area 602 are formed in each of the active areas. Specifically, the source area 601 is located on one side of the gate trench 102 and the drain area 602 is located on another side of the gate trench 102 opposite to said one side, and each of a bottom of the source area 601 and a bottom of the drain area 602 should be lower than the top of the gate conductive layer 104.

It should be noted that the source area 601 and the drain area 602 shown in FIG. 3 relate to a possible case in embodiments of the disclosure. In the actual embodiments, it is possible that the source area 601 and the drain area 602 are arranged in an opposite manner.

Specifically, in an embodiment where the substrate 101 includes a P-type substrate, N-type ions are implanted to form the source area 601. Accordingly, in an embodiment where the substrate 101 includes an N-type substrate, P-type ions are implanted to form the source area 601.

Figure 5:
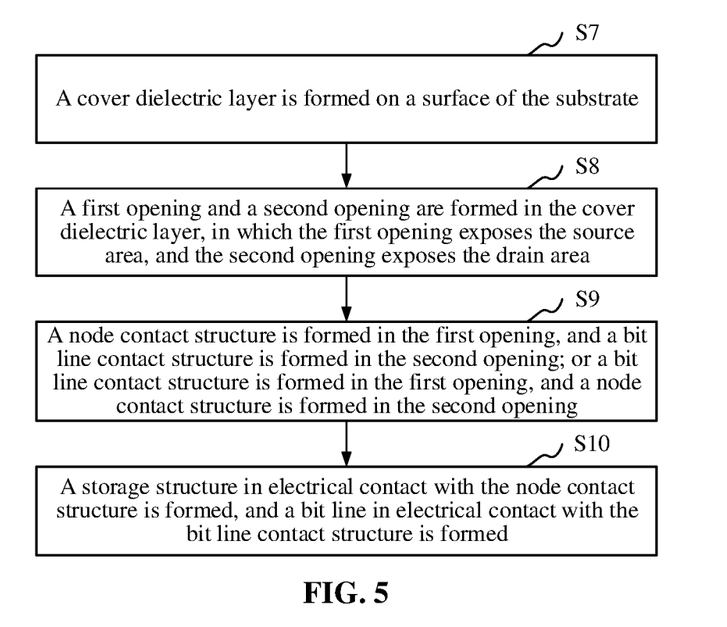
FIG. 5 is a flowchart of a method for manufacturing a semiconductor structure according to another embodiment of the disclosure.

With continuing reference to FIG. 5 in combination with FIG. 2 to FIG. 3, in an embodiment, after the source area 601 and the drain area 602 are formed in each of the active areas, the method includes the following operations.

At S7, a cover dielectric layer 701 is formed on a surface of the substrate 101.

At S8, a first opening and a second opening are formed in the cover dielectric layer 701, in which the first opening exposes the source area 601, and the second opening exposes the drain area 602.

At S9, a node contact structure 703 is formed in the first opening, and a bit line contact structure 702 is formed in the second opening; or in another embodiment, a bit line contact structure is formed in the first opening, and a node contact structure is formed in the second opening.

At S10, a storage structure 705 in electrical contact with the node contact structure 703 is formed, and a bit line 704 in electrical contact with the bit line contact structure 702 is formed.

According to embodiments of the disclosure, the material of the cover dielectric layer 701 formed on the surface of the substrate 101 at S7 is not specifically limited. As an example, the cover dielectric layer 701 includes, but is not limited to, one or more of a silicon dioxide layer, a silicon nitride layer, or a silicon oxynitride layer, etc. That is, the material of the cover dielectric layer 701 includes, but is not limited to, one or more of silicon dioxide, silicon nitride, or silicon oxynitride, etc.

According to embodiments of the disclosure, the manner in which the cover dielectric layer 701 is formed at S7 is not specifically limited. As an example, the cover dielectric layer 701 is formed on the surface of the substrate 101 using, but not limited to, any one of a PVD process or a CVD process.

According to embodiments of the disclosure, the manner in which the first opening and the second opening are formed in the cover dielectric layer 701 at S8 is not specifically limited. As an example, the operation that the first opening and the second opening are formed in the cover dielectric layer 701 is executed using the following manner. For example, a second photoresist layer having a first pattern and a second pattern is formed on the cover dielectric layer 701. The cover dielectric layer 701 and the substrate 101 are etched with the first pattern and the second pattern to form the first opening and the second opening, respectively.

At S9, each of the node contact structure 703 and the bit line contact structure 702 is electrically connected to a corresponding active area, and the node contact structure 703 has one-to-one correspondence to the bit line contact structure 702.

According to embodiments of the disclosure, the manner in which the node contact structure 703 and the bit line contact structure 702 are formed at S9 is not specifically limited. As an example, the operation that the node contact structure 703 and the bit line contact structure 702 are formed is executed using the following manner. For example, areas where the node contact structure 703 and the bit line contact structure 702 are formed are defined using a photoetching process. That is, a size and a position of the formed node contact structure 703 and bit line contact structure 702 is defined through the photoetching process. Polysilicon is deposited using any one of a PVD process, a CVD process, an FCVD process, an HDP process, a plasma-enhanced deposition process, or an atomic layer deposition process, etc., and ion doping is performed to prepare the node contact structure 703 and the bit line contact structure 702.

It should be understood that although the operations in the flowcharts of FIG. 1 and FIG. 5 are displayed in order according to the arrows, these operations are not necessarily executed in the order indicated by the arrows. The operations described are not strictly limited to the order in which they are performed, and that the operations may be performed in other orders, unless explicitly stated herein. Moreover, at least some of the operations in FIG. 1 and FIG. 5 may include multiple operations or multiple stages, and these operations or stages are not necessarily performed and completed at the same time, but may be performed at different times. These operations or stages are also not necessarily performed in sequence, but may be performed in turn or alternately with other operations or at least some of the operations or stages of other operations.

With continuing reference to FIG. 2 and FIG. 3, embodiments of the disclosure further provide a semiconductor structure, including a substrate 101, a gate trench 102, a gate oxide layer 103, and a gate conductive layer 104.

The gate trench 102 is located in the substrate 101. The gate oxide layer 103 is located on a side wall and a bottom of the gate trench 102. The gate conductive layer 104 is located on a surface of the gate oxide layer 103. A top of the gate conductive layer 104 is lower than a top of the gate trench 102.

The gate oxide layer 103 includes an ion implantation area a. It should be noted that a bottom of the ion implantation area a should be higher than a bottom of the gate conductive layer 104 and lower than the top of the gate conductive layer 104, and a top of the ion implantation area a should be higher than or flush with the top of the gate conductive layer 104.

The semiconductor structure according to embodiments of the disclosure has the gate oxide layer 103 including the ion implantation area a. An equivalent thickness of the gate oxide layer 103 is increased by the ion implantation area a, so that an electric field strength in a gate-drain overlap area is decreased, thereby reducing the GIDL effect in the obtained structure, improving the performance of the device, improving the yield and the reliability of the device, and avoiding the problems such as the error of the data access occurring in the device while reducing the leakage current when the device is in an off state, reducing the static power consumption, and prolonging the service life of the device. In the semiconductor structure according to embodiments of the disclosure, a bottom of the ion implantation area a in the gate oxide layer 103 is higher than a bottom of the gate conductive layer 104 and lower than the top of the gate conductive layer 104, and a top of the ion implantation area a is higher than or flush with the top of the gate conductive layer 104. That is, in the semiconductor structure according to embodiments of the disclosure, the ion implantation area a is located at an edge of the gate oxide layer 103, so that an equivalent thickness of the edge of the gate oxide layer 103 is increased, and an equivalent thickness of a part of the gate oxide layer 103 other than the ion implantation area a maintains unchanged, thereby ensuring that the performance of the device is not affected while reducing the GIDL effect in the obtained structure.

In the semiconductor structure according to embodiments of the disclosure, the material of the substrate 101 is not specifically limited. As an example, the substrate 101 includes, but is not limited to, any one or more of a silicon substrate, a sapphire substrate, a glass substrate, a silicon carbide substrate, a gallium nitride substrate, or a gallium arsenide substrate, etc. That is, the material of the substrate 101 includes, but is not limited to, any one or more of silicon, sapphire, glass, silicon carbide, gallium nitride, or gallium arsenide, etc.

In the semiconductor structure according to embodiments of the disclosure, the material of the gate oxide layer 103 is not specifically limited, either. As an example, the gate oxide layer 103 includes, but is not limited to, any one or more of a silicon dioxide layer, a high-k dielectric material layer, or other dielectric material layers, etc. That is, the material of the gate oxide layer 103 includes, but is not limited to, any one or more of silicon dioxide, high-k dielectric materials, or other dielectric materials, etc.

In the semiconductor structure according to embodiments of the disclosure, the material of the gate conductive layer 104 is not specifically limited, either. As an example, the gate conductive layer 104 includes, but is not limited to, any one or more of a titanium nitride layer, a titanium layer, a tungsten silicide layer, or a tungsten layer, etc. That is, the material of the gate conductive layer 104 includes, but is not limited to, any one or more of titanium nitride, titanium, tungsten silicide, or tungsten, etc.

According to embodiments of the disclosure, the type of doped ions in the ion implantation area a is not specifically limited. As an example, doped ions in the ion implantation area a include, but are not limited to, fluorine ions.

In an embodiment, doped ions in the ion implantation area a at least include fluorine ions.

In the semiconductor structure according to embodiments of the disclosure, doped ions in the ion implantation area a include fluorine ions, which cause an equivalent thickness of the edge of the gate oxide layer 103 to be increased, and an equivalent thickness of the part b of the gate oxide layer other than the ion implantation area maintains unchanged, thereby ensuring that the performance of the device is not affected while reducing the GIDL effect in the semiconductor structure.

As an example, the implantation dose of the fluorine ions in the ion implantation area a ranges from $1.5 \times 10^{14}$ ions/cm$^2$ to $5 \times 10^{14}$ ions/cm$^2$. For example, the implantation dose of the fluorine ions in the ion implantation area a is $1.5 \times 10^{14}$ ions/cm$^2$, $2.5 \times 10^{14}$ ions/cm$^2$, $3.5 \times 10^{14}$ ions/cm$^2$, $4.5 \times 10^{14}$ ions/cm$^2$, or $5 \times 10^{14}$ ions/cm$^2$, etc. It should be noted that the data is merely an example, and does not limit the implantation dose of the fluorine ions in the ion implantation area a in the actual embodiments.

With continuing reference to FIG. 2 and FIG. 3, in an embodiment, the semiconductor structure further includes a filling insulating layer 301. It should be noted that the filling insulating layer 301 should be located at the top of the gate conductive layer 104, and at least completely fill the gate trench 102.

In the semiconductor structure according to embodiments of the disclosure, the material of the filling insulating layer 301 is not specifically limited. As an example, the filling insulating layer 301 includes, but is not limited to, one or more of a silicon dioxide layer, a silicon nitride layer, or a silicon oxynitride layer, etc. That is to, the material of the filling insulating layer 301 includes, but is not limited to, one or more of silicon dioxide, silicon nitride, or silicon oxynitride, etc.

With continuing reference to FIG. 2 and FIG. 3, in an embodiment, Shallow Trench Isolation (STI) structures 401 are arranged in the substrate 101. Multiple active areas arranged at intervals in the substrate 101 are isolated from each other by the STI structures 401.

It can be understood that in the semiconductor structure according to embodiments of the disclosure, the STI structures 401 are formed by filling shallow trenches with an isolation material. As an example, the isolation material includes, but is not limited to, silicon dioxide.

With continuing reference to FIG. 2 and FIG. 3, in an embodiment, the semiconductor structure further includes a well area 105. The well area 105 is located in the active areas and located under the ion implantation area a.

With continuing reference to FIG. 2 and FIG. 3, in an embodiment, the semiconductor structure further includes a source area 601 and a drain area 602.

The source area 601 is located in each of the active areas and located on one side of the gate trench 102. The drain area 602 is located in each of the active areas and located on another side of the gate trench 102 away from the source area 601.

It should be noted that each of a bottom of the drain area 602 and a bottom of the source area 601 is lower than the top of the gate conductive layer 104.

With continuing reference to FIG. 2 and FIG. 3, in an embodiment, the semiconductor structure further includes a cover dielectric layer 701, a node contact structures 703, a bit line contact structure 702, a storage structure 705, and a bit line 704.

The cover dielectric layer 701 covers a surface of the substrate 101. The node contact structure 703 penetrates through the cover dielectric layer 701, and is in contact with one of the source area and the drain area. The bit line contact structure 702 also penetrates through the cover dielectric layer 701, and is in contact with the other one of the source area and the drain area. The storage structure 705 is in electrical contact with the node contact structure 703. The bit line 704 is in electrical contact with the bit line contact structure 702.

It can be understood that FIG. 3 depicts that the bit line contact structure 702 is in contact with the drain area 602, and the node contact structure 703 is in contact with the source area 601. In the actual embodiments, it is also possible that the bit line contact structure is in contact with the source area, and the node contact structure is in contact with the drain area.

In the semiconductor structure according to embodiments of the disclosure, the material of the cover dielectric layer 701 is not specifically limited. As an example, the cover dielectric layer 701 includes, but is not limited to, one or more of a silicon dioxide layer, a silicon nitride layer, or a silicon oxynitride layer, etc. That is, the material of the cover dielectric layer 701 includes, but is not limited to, one or more of silicon dioxide, silicon nitride, or silicon oxynitride, etc.

It can be understood that the device involved in embodiments of the disclosure includes, but is not limited to, a DRAM or a Static Random Access Memory (SRAM).

It should be noted that a method for manufacturing a semiconductor structure in embodiments of the disclosure can be used for manufacturing a corresponding semiconductor structure. Therefore, the technical features of the method embodiments and the technical features of the structure embodiments can be replaced and supplemented with each other under the premise of no conflict, so that those skilled in the art can learn the technical content of the disclosure.

It should be understood that operations described are not strictly limited to the order in which they are performed, and that the operations may be performed in other orders, unless explicitly stated herein. Moreover, at least some of the described operations may include multiple sub-operations or multiple stages, and these sub-operations or stages are not necessarily performed and completed at the same time, but may be performed at different times. These sub-operations or stages are also not necessarily performed in sequence, but may be performed in turn or alternately with other operations or at least some of the sub-operations or stages of other operations.

The embodiments in the disclosure are all described in a progressive manner, and each embodiment focuses on the differences from other embodiments, and the same and similar parts between the embodiments may be referred to each other.

The technical features of the embodiments above can be combined arbitrarily. In order to simplify the description, all possible combinations of the technical features in the embodiments above are not described. However, as long as the combinations of these technical features are not contradictory, they should all be considered to fall within the scope of the description.

The embodiments above only represent several embodiments of the disclosure, and the descriptions are relatively specific and detailed, but should not be construed as limiting the scope of the patent disclosure. It should be pointed out that for persons skilled in the art, several improvements and modifications can be made within the principle of embodiments of the disclosure, and these improvements and modifications should also be regarded as falling within the scope of protection of embodiments of the disclosure. Therefore, the scope of protection of embodiments of the disclosure shall be subject to the scope of protection of the claims.

The invention claimed is:

1. A method for manufacturing a semiconductor structure, comprising:
providing a substrate;
forming a gate trench in the substrate, and forming a gate oxide layer on a side wall and a bottom of the gate trench;
forming a gate conductive layer on a surface of the gate oxide layer, wherein a top of the gate conductive layer is lower than a top of the gate trench; and
performing ion implantation on the gate oxide layer to form an ion implantation area in the gate oxide layer, wherein a bottom of the ion implantation area is higher than a bottom of the gate conductive layer and lower than the top of the gate conductive layer, and a top of the ion implantation area is higher than or flush with the top of the gate conductive layer;
wherein performing ion implantation on the gate oxide layer comprises:
inclining the substrate by a preset angle, and performing horizontal ion implantation on the substrate; and during the horizontal ion implantation, rotating the obtained structure about a rotation axis for a preset number of times, wherein the rotation axis is a normal line to a surface of the substrate and passes through a midpoint of a bottom surface of the substrate
wherein the preset angle ranges from 15° to 40°, and the preset number of times ranges from 2 times to 8 times.

2. The method for manufacturing the semiconductor structure of claim 1, wherein ions implanted in a process of performing ion implantation on the gate oxide layer at least comprise fluorine ions.

3. The method for manufacturing the semiconductor structure of claim 1, wherein after performing ion implantation on the gate oxide layer, the method further comprises:
forming a filling insulating layer in the gate trench, wherein the filling insulating layer is located at the top of the gate conductive layer, and at least completely fills the gate trench.

4. The method for manufacturing the semiconductor structure of claim 3, wherein shallow trench isolation structures are formed in the substrate, and multiple active areas arranged at intervals in the substrate are isolated from each other by the shallow trench isolation structures; and
wherein after forming the filling insulating layer in the gate trench, the method further comprises:
forming a drain area and a source area in each of the active areas, wherein the source area is located on one side of the gate trench and the drain area is located on another side of the gate trench opposite to said one side, and each of a bottom of the source area and a bottom of the drain area is lower than the top of the gate conductive layer.

5. The method for manufacturing the semiconductor structure of claim 4, wherein before forming the gate trench in the substrate, the method further comprises:
forming a well area in the active areas, wherein the well area is located under the ion implantation area.

6. The method for manufacturing the semiconductor structure of claim 4, wherein after forming the source area and the drain area in each of the active areas, the method further comprises:
forming a cover dielectric layer on a surface of the substrate;
forming a first opening and a second opening in the cover dielectric layer, wherein the first opening exposes the source area, and the second opening exposes the drain area;
forming a node contact structure in the first opening, and forming a bit line contact structure in the second opening; or forming a bit line contact structure in the first opening, and forming a node contact structure in the second opening; and
forming a storage structure in electrical contact with the node contact structure, and forming a bit line in electrical contact with the bit line contact structure.

* * * * *